United States Patent [19]

Haddad et al.

[11] Patent Number: 4,912,539

[45] Date of Patent: Mar. 27, 1990

[54] NARROW-BAND-GAP BASE TRANSISTOR STRUCTURE WITH DUAL COLLECTOR-BASE BARRIER INCLUDING A GRADED BARRIER

[75] Inventors: George I. Haddad, Ann Arbor; Richard K. Mains, Ypsilanti, both of Mich.

[73] Assignee: The University of Michigan, Ann Arbor, Mich.

[21] Appl. No.: 229,005

[22] Filed: Aug. 5, 1988

[51] Int. Cl.[4] .................... H01L 29/72; H01L 29/205
[52] U.S. Cl. ........................................ 357/34; 357/16; 357/4
[58] Field of Search ................................ 357/34, 16, 4

[56] References Cited

U.S. PATENT DOCUMENTS

| 4,691,215 | 9/1987 | Luryi | 357/34 |
| 4,758,870 | 7/1988 | Hase et al. | 357/34 |
| 4,797,722 | 1/1989 | Shannon | 357/34 |

FOREIGN PATENT DOCUMENTS 0159273 10/1985 European Pat. Off. .............. 357/4
0186301 7/1986 European Pat. Off. ............. 357/34

Primary Examiner—Andrew J. James
Assistant Examiner—Jerome Jackson, Jr.
Attorney, Agent, or Firm—Rohm & Monsanto

[57] ABSTRACT

A semiconductor structure, in the form of a resonant-tunneling transistor employs a quantum well region which is at a lower potential than the conduction band edge in the contacts, as a result of the lower band gap of InGaAs relative to GaAs. Thus, the first energy level in the well lies below the conduction band edge in the contact, and therefore base electrons are retained in bond states. In addition, the base-collector barrier is extended by a gradient of $Al_xGa_{1-x}As$. In the specific embodiment, the barrier is extended by some 300 Å, and the proportion of Al decreases away from the barrier until only n+GaAs is present. In this manner, tunneling current between the base and collector is significantly reduced, without adversely affecting emitter-collector tunneling current. The structure described herein can be used in a variety of materials, and transistor structures, such as the induced base transistor, in addition to the resonant-tunneling transistor.

16 Claims, 4 Drawing Sheets

NARROW-BAND-GAP BASE TRANSISTOR STRUCTURE WITH DUAL COLLECTOR-BASE BARRIER INCLUDING A GRADED BARRIER

RIGHTS OF THE U.S. GOVERNMENT

This invention was made with government support under contract (Contract Number DAAL03-87-K-0007) awarded by the U.S. Army Research Office. The government has certain rights in the invention.

BACKGROUND OF THE INVENTION

This invention relates generally to semiconductor devices, and more particularly, to a transistor structure which alleviates problems associated with high base resistance in the narrow quantum well, or band gap, base region of certain transistor structures, by creating bound states in the quantum-well by using a base material having a lower band gap than the contact layers.

Resonant tunneling devices were first investigated by L. Chang et al. 24 Applied Physics Letters 593 (1974), the quantum well characteristics of such devices being applicable to two-terminal and three-terminal semiconductor devices. Generally, resonant tunneling is achieved when a bias potential across a plurality of terminals is established such that one of the bound states in the quantum well has the same energy level as the Fermi level of the input electrode. It is a significant advantage of semiconductor devices which operate under the resonant tunneling regime that very fast charge transfer is achieved, resulting in generally excellent high speed switching characteristics for the devices.

It is a problem with three-terminal tunneling semiconductor devices that a tunneling leakage current between the base and collector regions substantially diminishes the current gain of the device. The obvious approach to this difficulty is to increase the width of the barrier between the base and collector. However, such increased barrier width also tends to decrease the magnitude of the desired emitter-to-collector tunneling current. There is therefore a need for a three-terminal semiconductor device wherein high current gain is maintained without significantly impeding emitter-to-collector tunneling current.

It is, therefore, an object of this invention to provide a transistor structure which reduces undesirable base-to-collector tunneling.

It is another object of this invention to provide a transistor structure which improves transistor gain without reducing desired emitter-to-collector resonant tunneling current.

It is also an object of this invention to provide a resonant-tunneling transistor structure which exhibits high current gain.

It is a further object of this invention to provide a transistor structure which alleviates the problem of high base-to-collector tunneling current as bias is applied.

It is additionally an object of this invention to provide a semiconductor device which retains a high switching speed while affording reduced leakage current.

It is yet a further object of this invention to provide a resonant-tunneling transistor which affords a reduced base-to-collector capacitance.

It is also another object of this invention to provide a transistor structure which affords an equipotential base region for the application of bias.

It is yet an additional object of this invention to provide a transistor structure in which base current does not tunnel to the collector in significant measure.

It is still another object of this invention to provide a transistor structure which exhibits reduced base resistance.

SUMMARY OF THE INVENTION

The foregoing and other objects are achieved by this invention which provides a three-terminal semiconductor device, the terminals being designated as emitter, collector, and base terminals, the device having emitter and collector contact regions formed of n+ semiconductor material with predetermined band edge potential. A quantum well region is physically interposed between the collector and emitter regions, and has associated therewith a predetermined quantum well potential for an associated first energy level. The associated first energy level is lower than the emitter and collector contact region band edge potentials. In accordance with the invention, a first barrier is physically interposed between the emitter and quantum well regions, and a second barrier is interposed between the collector and quantum well regions.

In a preferred embodiment of the invention, the quantum well region is formed of $In_{0.25}Ga_{0.75}As$, and has a thickness of approximately 67.4 Å. The barriers are preferably formed of semiconductor material having the general formula $Al_xGa_{1-x}As$. However, in a preferred embodiment, the semiconductor barrier material is $Al_{0.3}Ga_{0.7}As$. In one embodiment, the barriers each have a thickness of approximately 28 Å.

In a specific illustrative embodiment of the invention, the n+ semiconductor material which forms the emitter and collector contact regions is GaAs. Preferably, this material is doped to approximately $10^{18}$ cm$^{-3}$.

In accordance with a further aspect of the invention, the present semiconductor device is formed of a plurality of layers of semiconductor material which are in communication with one another. A first such layer is formed of GaAs semiconductor material which is doped to approximately $10^{18}$ cm$^{-3}$. A second layer which communicates with the first layer is formed of $Al_xGa_{1-x}As$ semiconductor material which forms a first barrier. A third layer, which is arranged to communicate with the second layer, is formed of $In_xGa_{1-x}As$, and serves as a quantum well. A fourth layer is arranged to communicate with the third layer, and is formed of $Al_xGa_{1-x}As$ semiconductor material and forms a second barrier. A fifth layer which is formed of GaAs semiconductor material doped to approximately $10^{18}$ cm$^{-3}$ is arranged to communicate with the fourth layer.

In the practice of the further aspect of the invention, in the form of a three-terminal semiconductor device, an emitter contact is arranged to couple electrically with the first layer. Additionally, a base contact is arranged to communicate electrically with the third layer, and a collector contact communicates electrically with the fifth layer. The five such layers may be installed on a sixth layer which constitutes a substrate.

In a preferred embodiment of this further aspect of the invention, the second and fourth layers have a thickness of approximately 28 Å, while the third layer, or quantum well layer, has a thickness of approximately 67.4 Å. In addition, the first layer, which serves as an emitter region, can be provided in a practical embodiment of the invention with a thickness of approximately 0.3 micron. The fifth layer, which serves as the collector region, may have a thickness of approximately 1.0 micron.

BRIEF DESCRIPTION OF THE DRAWING

Comprehension of the invention is facilitated by reading the following detailed description, in conjunction with the annexed drawing, in which.

DETAILED DESCRIPTION

Figure 1:
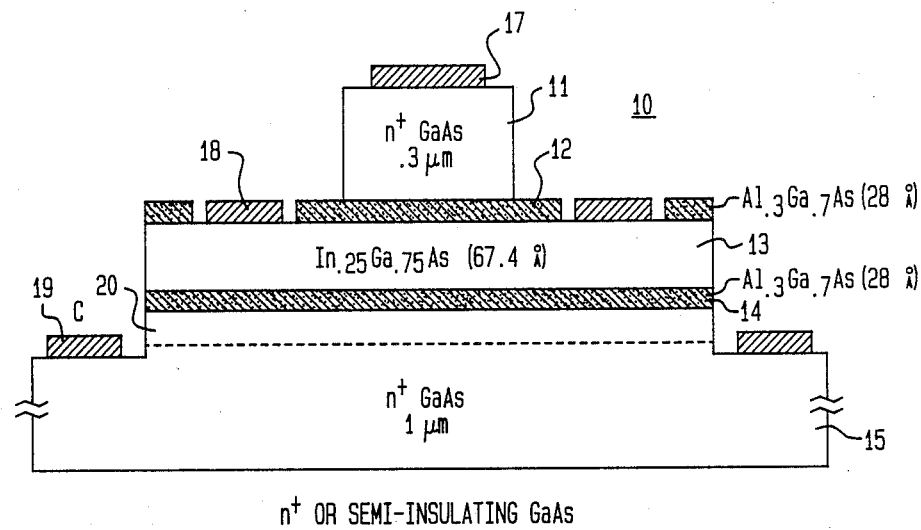
FIG. 1 is a schematic representation of a semiconductor device constructed in accordance with the principles of the invention.

FIG. 1 is a schematic representation of a specific illustrative transistor structure 10 which has been constructed in accordance with the principles of the invention. More specifically, transistor structure 10 is formed of a plurality of layers, designated as layers 11-15. Layers 11-15 are disposed on a substrate layer (not shown) which may be formed of $n^+$ or semi-insulating GaAs material. For sake of clarity, the elements of structure are not drawn to scale.

Layer 11, in this specific illustrative embodiment, is formed of $n^+$ GaAs, and has a thickness of approximately 0.3 μm. Layer 11 is arranged adjacent to layer 12 which is formed of $Al_{0.3}Ga_{0.7}As$. This layer, which operates as a barrier, has a thickness in this embodiment of 28 Å. Layer 14, which is another barrier layer, is formed of the same material as layer 12, and has a thickness of 28 Å in this embodiment.

Layer 13 is interposed between barrier layers 12 and 14, and serves as the quantum well layer. This layer, in this specific embodiment, is formed of $In_xGa_{1-x}As$, and in a preferred embodiment, is formed of $In_{0.25}Ga_{0.75}As$. Layer 14 is arranged in communication with layer 15, as shown. In this embodiment, layer 15 may have a thickness of approximately 1 μm.

Selected ones of the layers are provided with contact members which are denominated in accordance with conventional transistor terminology. For these purposes, layer 11 has electrically coupled thereto a contact 17 which functions as an emitter. Layer 13 has coupled thereto a contact 18 which operates as base, and layer 15 has coupled thereto a contact 19 which functions as a collector.

As is evident from the foregoing, the specific illustrative device described immediately hereinabove consists of two 28 Å barriers formed of $Al_{0.3}Ga_{0.7}As$, surrounding a 67.4 Å well formed of $In_xGa_{1-x}As$. The $n^+$ GaAs contact regions are doped at $10^{18}$ cm$^{-3}$. The well region is at a lower potential than the conduction band edge in the contacts, due to the lower band gap of InGaAs relative to GaAs. In accordance with the invention, therefore, the first energy level in the well lies below the conduction band edge in the contacts.

In accordance with a particularly advantageous aspect of the invention, layer 15 is provided with a region 20 which is formed of a gradient of $Al_xGa_{1-x}As$. More specifically, in the region of layer 15 adjacent to barrier layer 14, the barrier is extended by some 300 Å; the proportion of the Al decreasing away from the barrier until only $n^+$ GaAs is present. In the absence of the extended barrier region, such that only the single 28 Å barrier separates the base from the collector, the specific illustrative embodiment of the invention might be subject to the problem of large tunneling currents from base to collector. However, it is to be understood that the mere widening of the barrier is not sufficient to alleviate the problem, particularly in view of the fact that a wide or extended barrier, will generally also reduce the desired resonant tunneling from emitter to collector. In the present invention, the problem is solved by virtue of the fact that electrons from the base lead occupy lower energy states than conduction electrons injected from the emitter.

Figure 2:
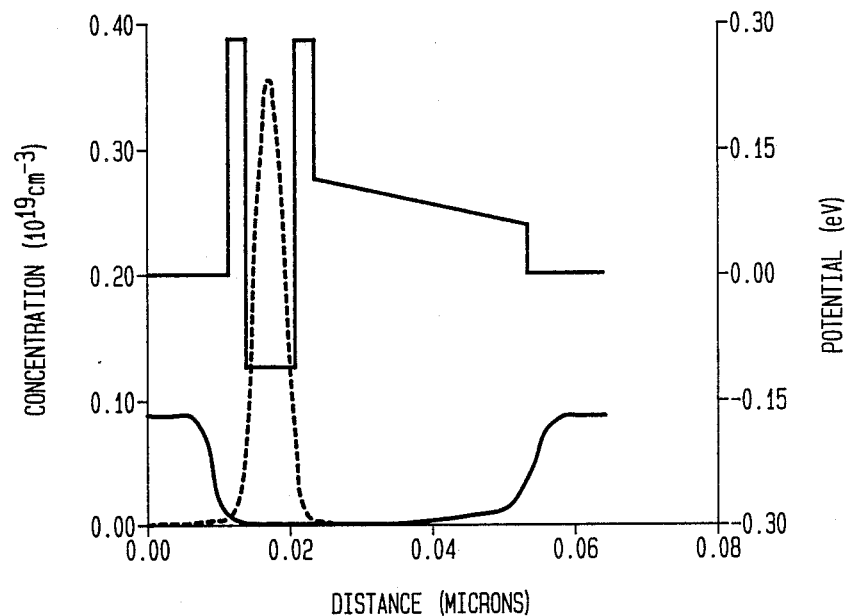
FIG. 2 is an energy diagram for the resonant tunneling transistor of the present invention at zero bias with a 300 Å extension of the base-collector barrier from 0.1125 eV to 0.0562 eV.

FIG. 2 is a graphical representation illustrating the structure of a device constructed in accordance with the present invention (upper solid curve), the bound-state electron concentration of the base occupying the first level (dashed curve), and the density of free electrons (lower solid curve), incident from particle reservoirs in the contacts. The structure, as represented in this figure, is shown to have a base-emitter barrier (left peak of the upper solid curve) and a base-collector barrier (right peak of the upper solid curve).

As is evident from FIG. 2, the base-collector barrier is extended (downward sloping portion adjacent to the base-collector barrier) by 300 Å between the energy values of 0.1125 eV and 0.0562 eV. With a $V_{BE}=0.1125$ V applied, the knee of the base-collector barrier lines up with the conduction band edge in the emitter, so that the injected electrons effectively see the same barrier as before.

Figure 3:
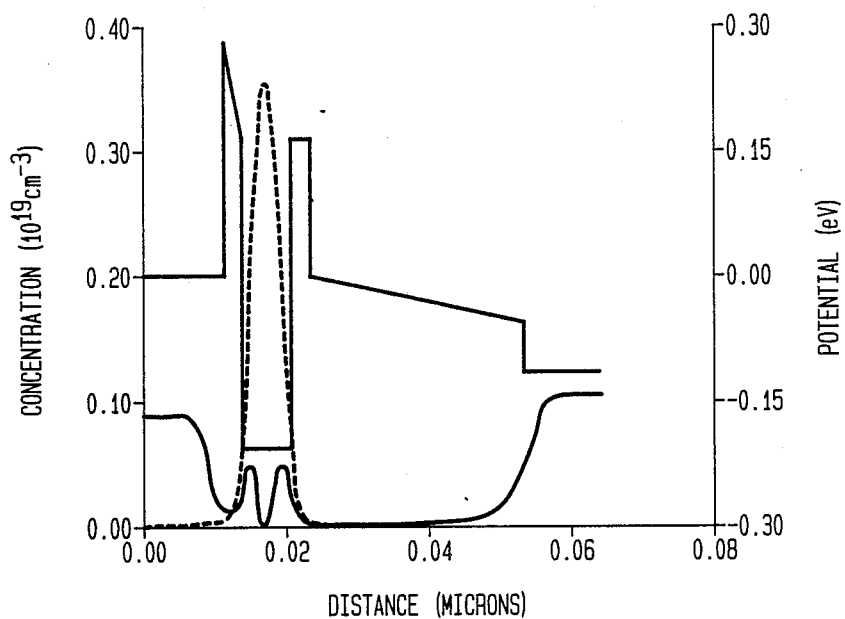
FIG. 3 is an energy diagram for the device of FIG. 2 with $V_{BE}=0.1125$ V, and $V_{CE}=0.145$ V.

FIG. 3 is similar to the graphical representation of FIG. 2, and illustrates the structure of a device constructed in accordance with the present invention (upper solid curve), the bound-state electron concentration of the base occupying the first level (dashed curve), and the density of free electrons (lower solid curve), incident from particle reservoirs in the contacts. As previously discussed, the structure has a base-emitter barrier (left peak of the upper solid curve) and a base-collector barrier (right peak of the upper solid curve).

The double-peaked wave function for injected electrons is evident in FIG. 3. This figure illustrates an energy diagram for the device of FIG. 2 with $V_{BE}=0.1125$ V, and $V_{CE}=0.145$ V.

Figure 4:
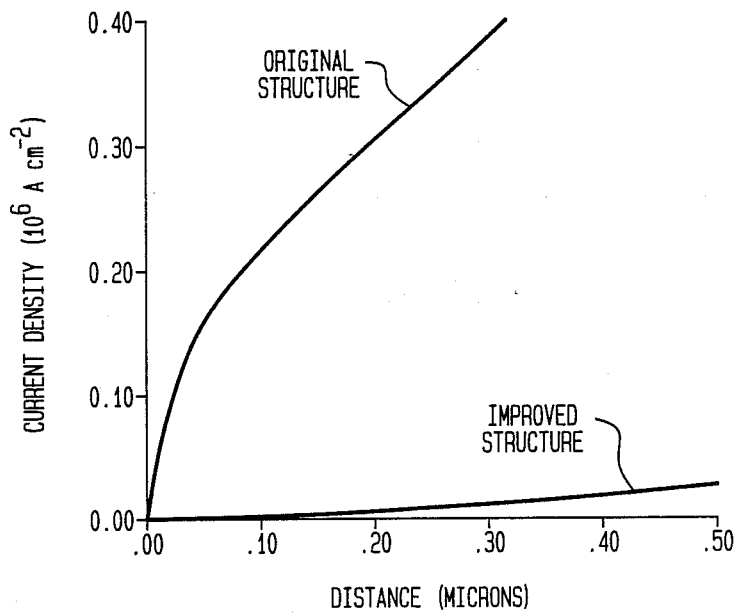
FIG. 4 is a graphical representation of the base-collector tunneling current and illustrating the improvement which is achieved with the use of the present invention.

FIG. 4 is a graphical representation which compares the base-collector tunneling current for the structure of the present invention, against the base-collector tunneling current for a similar structure (not shown) without the inventive extended base-collector barrier. The curves shown in this figure were obtained by removing the first barrier between the emitter and base. When the embodiment of the present invention is biased at the peak emitter-collector current point, and when $V_{CB}=0.1$ V, the leakage current in FIG. 4 is lowered by a factor of 100 from the desired emitter-collector current.

Figure 5:
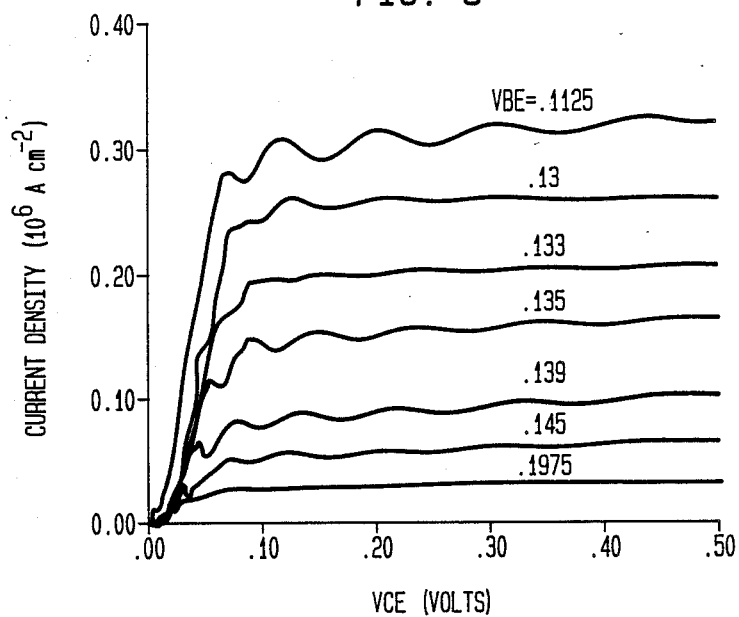
FIG. 5 is a graphical representation corresponding to static I-V curves at room temperature for the device represented in FIG. 2, with $V_{BE}$ as the parameter.

Static I-V curves were calculated for the embodiment of FIG. 2, and are illustrated in FIG. 5. The resonant tunneling current magnitude of the specific illustrative embodiment is nearly equal to the resonant-tunneling current of embodiments without the base-collector barrier extension. However, the ringing which is evident in the I-V characteristic of this figure is caused by additional reflections from the base-collector barrier extension.

Figure 6:
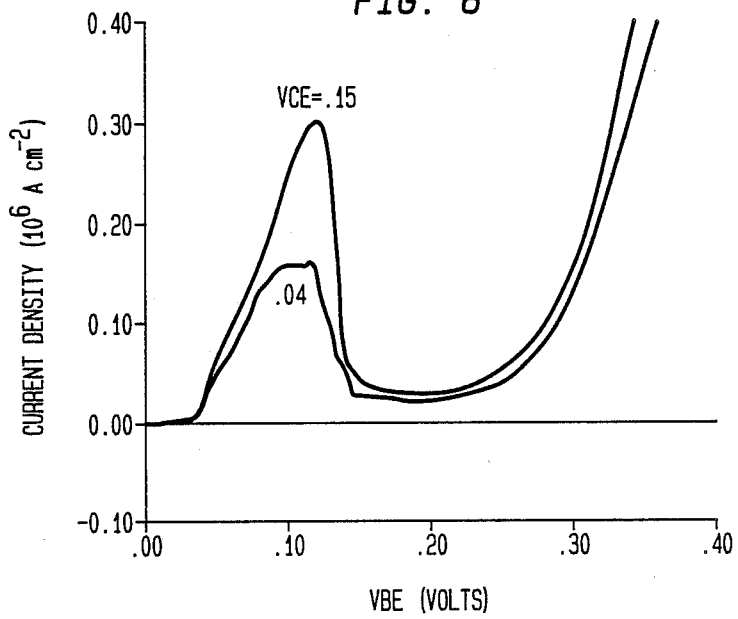
FIG. 6 is a graphical representation corresponding to static I-V curves at room temperature for the device represented in FIG. 2, with $V_{CE}$ as the parameter.
Figure 7:
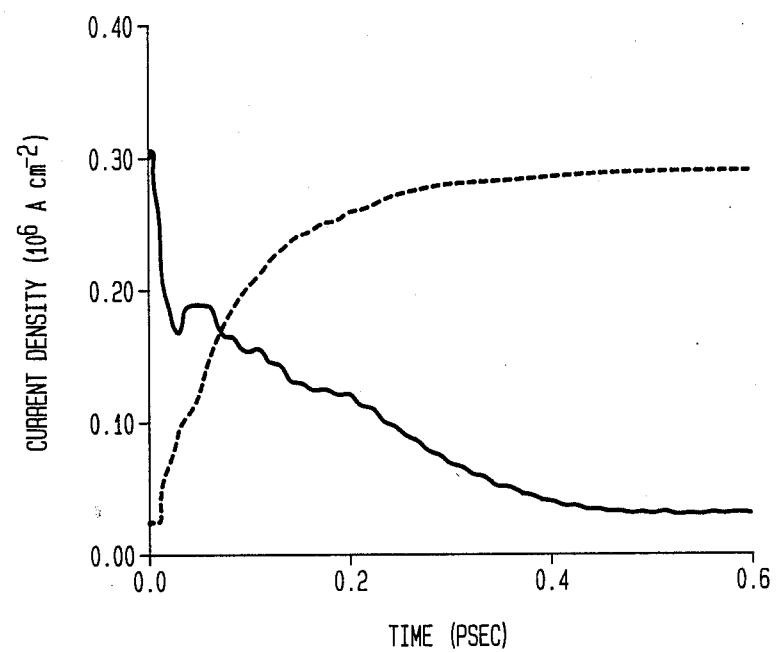
FIG. 7 is a graphical representation of the switching transients for the device of FIG. 2 between $V_{BE}=0.1125$ V and $V_{BE}=0.1975$ V (solid), and between $V_{BE}=0.1975$ V and $V_{BE}=0.1125$ V (dashed), both with constant $V_{CE}=0.145$ V.

FIG. 5 further illustrates operation of the structure of the present invention in the negative transconductance region, in view of increases in $V_{BE}$ resulting in decreased current. The negative transconductance is more clearly evident from FIG. 6, where the current is plotted against $V_{BE}$, with $V_{CE}$ as the parameter. FIG. 6 additionally illustrates the manner in which the current can be quenched by suitably biasing $V_{CE}$ parameter. FIG. 6 additionally illustrates the manner in which Since the structure of the device of the present invention, as represented in FIG. 2 is significantly longer than that of the resonant-tunneling transistor without the extended base-collector barrier, it is expected that the switching transients will be effected. FIG. 7 is a graphical representation illustrating the transients. In this figure, the dashed curve represents the turn-on transient of the device constructed in accordance with the invention, and the solid curve represents the turn-off transient. The transients represented in this figure, due to the extended base-collector barrier of the device of the present invention, correspond to an increase in the duration of the turn-on transient from approximately 0.15 ps to 0.3 ps, while the turn-off transient is increased from approximately 0.3 ps to 0.5 ps.

The extended base-collector barrier affords additional advantages besides reduction of the leakage current. More specifically, the base-to-collector capacitance is significantly reduced. Consequently, the displacement currents associated with biased changes across the junction are similarly reduced. In addition, the base contact of the device with the extended barrier is easier to realize, since punch-through to the collector is less likely.

In the analysis of the present embodiment, it is assumed that the well is 0.11 eV below the GaAs conduction band edge. The barrier height at the GaAs-AlGaAs interface is assumed to be 0.28 eV. Assuming an effective mass value of 0.56 $m_0$ for electrons in the InGaAs region, it is found that the first energy level is 0.0738 eV above the bottom of the well.

The bound electrons in the base allow application of bias to the device. Since these electrons are bound, they will not contribute appreciably to base current flow other than for the displacement current accompanying changes of bias. With proper bias applied to the device, the free electrons will tunnel resonantly through the second energy level in the well, which is a quasi-bound state located approximately 0.094 eV above the Fermi level at zero bias.

In the foregoing analysis, space charge effects and scattering mechanisms have not been included. The base current which results from scattering has not been calculated, and the displacement current in the representations herein of transient currents.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A semiconductor device comprising:
    a first layer formed on GaAs semiconductor material doped to approximately $10^{18}$ cm$^{-3}$;
    a second layer communicating with said first layer, said second layer being formed of $Al_xGa_{1-x}As$ semiconductor material for forming a first barrier;
    a third layer communicating with said second layer, said third layer being formed of $In_xGa_{1-x}As$ for forming a quantum well;
    a fourth layer communicating with said third layer, said fourth layer being formed of $Al_xGa_{1-x}As$ semiconductor material for forming a second barrier; and
    a fifth layer formed of GaAs semiconductor material doped to approximately $10^{18}$ cm$^{-3}$, said fifth layer having in the vicinity of said fourth layer a region formed of a gradient of $Al_xGa_{1-x}As$ semiconductor material for forming an extension of said second barrier.

2. The semiconductor device of claim 1 wherein there are further provided:
    emitter contact means for coupling electrically to said first layer;
    base contact means for coupling electrically to said third layer; and
    collector contact means for coupling electrically to said fifth layer.

3. The semiconductor device of claim 1 wherein there is further provided a sixth layer for forming a substrate.

4. The semiconductor device of claim 1 wherein said second and fourth layers each have a thickness of approximately 28 Å.

5. The semiconductor device of claim 1 wherein said third layer has a thickness of approximately 67.4 Å.

6. The semiconductor device of claim 1 wherein said first layer has a thickness of approximately 0.3 μm.

7. The semiconductor device of claim 1 wherein said fifth layer has a thickness of approximately 1.0 μm.

8. The semiconductor device of claim 1 wherein said third layer is formed of $In_{0.25}Ga_{0.75}As$.

9. A semiconductor device of the type having emitter, collector, and base terminals, the semiconductor device comprising:
    an emitter contact region formed of n+ semiconductor material and having a predetermined conduction band edge potential;
    a collector contact region formed of n+ semiconductor material and having a predetermined conduction band edge potential;
    a quantum well region interposed between said collector and emitter regions, said quantum well region having a predetermined quantum well potential for its associated first energy level which is lower than said emitter and collector contact region conduction band edge potentials;
    a first barrier formed of a semiconductor barrier material having the general formula $Al_xGa_{1-x}As$, said first barrier being interposed between said emitter and quantum well regions;

a second barrier formed of a semiconductor barrier material having the general formula $Al_xGa_{1-x}As$, said second barrier being interposed between said collector and quantium well regions; and barrier extension means formed of a gradient composition of $Al_xGa_{1-x}As$ for extending said second barrier toward said collector contact region.

10. The semiconductor device of claim 9 wherein there is further provided a base contact coupled electrically to said quantum well region.

11. The semiconductor device of claim 9 wherein said quantum well region is formed of $In_{0.25}Ga_{0.75}As$.

12. The semiconductor device of claim 11 wherein said quantum well region has a thickness of approximately 67.4 Å.

13. The semiconductor device of claim 9 wherein said semiconductor barrier material from which said first and second barriers are formed is $Al_{0.3}Ga_{0.7}As$.

14. The semiconductor device of claim 9 wherein said first and second barriers each have a thickness of approximately 28 Å.

15. The semiconductor device of claim 9 wherein said n+ semiconductor material which forms said emitter contact region is GaAs doped at approximately $10^{18}$ cm$^{-3}$.

16. The semiconductor device of claim 9 wherein said n+ semiconductor material which forms said collector contact region is GaAs doped at approximately $10^{18}$ cm$^{-3}$.

* * * * *